(12) United States Patent
Latrasse et al.

(10) Patent No.: US 11,961,713 B2
(45) Date of Patent: Apr. 16, 2024

(54) MICROWAVE COUPLING/COMBINING DEVICE AND ASSOCIATED MICROWAVE GENERATOR

(71) Applicant: SAIREM SOCIETE POUR L'APPLICATION INDUSTRIELLE DE LA RECHERCHE EN ELECTRONIQUE ET MICRO ONDES, Decines Charpieu (FR)

(72) Inventors: Louis Latrasse, Dommartin (FR); Thibault Gadeyne, Meximieux (FR)

(73) Assignee: SAIREM SOCIETE POUR L'APPLICATION INDUSTRIELLE DE LA RECHERCHE EN ELECTRONIQUE ET MICRO ONDES, Decines Charpieu (FR)

( * ) Notice: Subject to any disclaimer, the term of this patent is extended or adjusted under 35 U.S.C. 154(b) by 709 days.

(21) Appl. No.: 17/055,680

(22) PCT Filed: May 22, 2019

(86) PCT No.: PCT/FR2019/051167
§ 371 (c)(1),
(2) Date: Nov. 16, 2020

(87) PCT Pub. No.: WO2019/224481
PCT Pub. Date: Nov. 28, 2019

(65) Prior Publication Data
US 2021/0202212 A1    Jul. 1, 2021

(30) Foreign Application Priority Data
May 23, 2018  (FR) ........................ 18/54315

(51) Int. Cl.
*H01P 5/103* (2006.01)
*H01J 37/32* (2006.01)
*H01P 5/12* (2006.01)

(52) U.S. Cl.
CPC .. *H01J 37/32229* (2013.01); *H01J 37/32201* (2013.01); *H01J 37/32311* (2013.01); *H01P 5/103* (2013.01); *H01P 5/12* (2013.01)

(58) Field of Classification Search
CPC .... H01P 5/103; H01P 5/12; H01P 5/10; H01P 5/08; H01J 37/32229; H01J 37/32201; H01J 37/32311
See application file for complete search history.

(56) References Cited

FOREIGN PATENT DOCUMENTS

| CN | 102569971 A | 7/2012 |
|----|-------------|--------|
| CN | 202749491 U | 2/2013 |

(Continued)

OTHER PUBLICATIONS

Machine Translation of CN205406695U (Year: 2016).*
International Search Report dated Aug. 13, 2019 re: Application No. PCT/FR2019/051167, pp. 1-2.

*Primary Examiner* — Stephen E. Jones
(74) *Attorney, Agent, or Firm* — CANTOR COLBURN LLP

(57) ABSTRACT

A microwave coupling/combining device for coupling and combining at least two microwave sources includes a waveguide provided with a sleeve extending longitudinally along a main axis and having two opposing ends having a first end provided with an element forming a short-circuit and a second open end. The device further includes at least one transverse bar extending inside the sleeve along a transverse axis orthogonal to the main axis; and at least two coaxial connectors provided for being connected respectively to microwave sources. Each coaxial connector is mounted externally on the sleeve and has a central conductive core (Continued)

connected to and extended by a conductive antenna extending in a direction orthogonal to the transverse axis and to the main axis inside the sleeve and ending by an end attached to a transverse bar.

25 Claims, 5 Drawing Sheets

(56) References Cited

FOREIGN PATENT DOCUMENTS

| | | |
|---|---|---|
| CN | 202977681 U | 6/2013 |
| CN | 205406695 U | 7/2016 |
| GB | 781882 A | 8/1957 |
| WO | 2018016071 A1 | 1/2018 |

* cited by examiner

MICROWAVE COUPLING/COMBINING DEVICE AND ASSOCIATED MICROWAVE GENERATOR

TECHNICAL FIELD

The present disclosure relates to a microwave coupling/combining device for coupling and combining at least two microwave sources, as well as to a microwave generator comprising microwave sources whose powers are coupled and combined by means of such a microwave coupling/combining device It relates more particularly to a microwave coupling/combining device for combining microwave powers coming from several microwave sources, and particularly to a microwave coupling/combining device with coaxial/waveguide transitions and suitable for solid state microwave sources (or transistor microwave generators).

BACKGROUND

Conventionally, it is known to use magnetrons to generate microwaves, which have the advantage of providing high microwave power. These magnetrons emit microwaves at a given frequency which is fixed, at a fixed power and at a fixed temperature (or cooling). However, such a frequency is generally not very stable and therefore poorly controlled, depending for example on variations in power, ambient air temperature, cooling water temperature, etc.

It is also known to use solid state microwave generators (or transistor microwave generators) which overcome the main deficit of the magnetron, by making it possible to emit microwaves at a controlled frequency, and even to make vary the frequency precisely by varying the frequency of the oscillator which controls them by means of a frequency adjustment system.

However, solid state microwave generators, which can output power over coaxial cables, are quite limited in power, in particular in the range of a few hundred watts in the microwave area. Moreover, the power of solid state microwave generators is self-limiting in the sense that the coaxial output itself has a power limitation, by design itself.

Thus, to increase the power available with solid state technology, it is appropriate to combine the power of several solid state microwave generators having coaxial outputs.

It is thus known from the document CN 205 406 695 U to use a microwave coupling/combining device comprising a waveguide and several coaxial connectors mounted externally on the waveguide, without a detailed explanation of the implementation of a coupling between the waveguide and each coaxial connector.

The state of the art can also be illustrated by the teaching of the document CN 202 977 681, which discloses a microwave coupling/combining device comprising a waveguide and several coaxial connectors mounted externally on the waveguide, with coaxial probes used to perform a coupling of the microwave powers coming from the coaxial connectors. With such coaxial probes, the propagation and the combination of the microwave powers coming from two opposite coaxial connectors take place in the axis common to these coaxial connectors and to the concerned coaxial probe, and therefore leads to an inefficient thermal dissipation which goes to the detriment of the power values that can be combined.

SUMMARY

The present disclosure therefore proposes a microwave coupling/combining device which makes it possible to combine the powers of several microwave sources, and in particular of several solid state microwave sources.

The disclosure also proposes a microwave coupling/combining device which offers a small bulk, and therefore which makes it possible to deliver a large microwave power (at the output of the microwave coupling/combining device) while being corn pact.

The disclosure further proposes a microwave coupling/combining device which makes it possible to combine the powers of several microwave sources while improving the heat dissipation necessarily produced with this combination of powers.

The disclosure also provides a microwave coupling/combining device suitable for microwaves in the microwave frequency bands of industrial, scientific and medical (ISM) use allocated by the International Telecommunication Union (ITU), and in particular the microwave frequency bands 2.450 GHz±50.0 MHz, 5.800 GHz±75.0 MHz, 433.92 MHz±0.87 MHz, 896±10 MHz and 915 MHz±13 MHz.

To this end, the disclosure proposes a microwave coupling/combining device for coupling and combining at least two microwave sources, comprising a waveguide provided with:

a sleeve extending longitudinally along a main axis and having two opposite ends comprising a first end provided with a short-circuiting element and a second open end; and
  at least one transverse bar extending inside the sleeve along a transverse axis orthogonal to the main axis;
  said microwave coupling/combining device further comprising at least two coaxial connectors provided to be respectively connected to microwave sources,
  wherein each coaxial connector is mounted externally on the sleeve and has a conductive central core connected to and extended by a conductive antenna extending inside the conductive sleeve and ending by an end attached to a transverse bar, wherein said conductive central core and said conductive antenna are aligned and extend in a direction orthogonal to the transverse axis and to the main axis.

Thus, the disclosure proposes to combine the powers of several microwave sources, and in particular of several solid state microwave sources, having a coaxial output, in order to generate an increased microwave output power, while offering a compact configuration.

In a first embodiment, the at least two coaxial connectors comprise two contiguous coaxial connectors whose conductive antennas are fixed on a same transverse bar, these contiguous coaxial connectors being disposed side by side in a direction parallel to the transverse axis of the transverse bar, said plane of symmetry also including a secondary axis which is both orthogonal to the main axis and to the transverse axis of a transverse bar.

According to one feature, the two contiguous coaxial connectors are arranged symmetrically on either side of a plane of symmetry of the sleeve including the main axis.

In a second embodiment, the waveguide comprises at least one proximal transverse bar and a distal transverse bar parallel and offset from each other along the main axis, and the at least two coaxial connectors comprise at least one coaxial proximal connector whose conductive antenna is fixed on the proximal transverse bar and at least one distal coaxial connector whose conductive antenna is fixed on the distal transverse bar.

According to one feature, the proximal coaxial connector and the distal coaxial connector are offset from each other in a direction parallel to the main axis.

In a particular embodiment combining the first embodiment and the second embodiment, the at least two coaxial connectors comprise:
  two proximal contiguous coaxial connectors whose conductive antennas are fixed on the proximal transverse bar; and
  two distal contiguous coaxial connectors whose conductive antennas are fixed on the distal transverse bar.

In a third embodiment, the waveguide comprises at least one upper transverse bar and one lower transverse bar parallel and offset from one another along a secondary axis both orthogonal to the main axis and to the transverse axes of said transverse bars so that the upper transverse bar and the lower transverse bar extend in a common plane orthogonal to the main axis, and the at least two coaxial connectors comprise at least one upper coaxial connector mounted on an upper face of the sleeve and whose conductive antenna is fixed on the upper transverse bar and at least one lower coaxial connector mounted on a lower face of the sleeve and whose conductive antenna is fixed on the lower transverse bar, and in which the lower coaxial connector and the upper coaxial connector extend into the common plane.

According to one feature, the conductive antenna of the lower coaxial connector and the conductive antenna of the upper coaxial connector are aligned.

In a particular embodiment combining the first embodiment and the third embodiment, the at least two coaxial connectors comprise:
  two upper contiguous coaxial connectors whose conductive antennas are fixed on the upper transverse bar; and
  two lower contiguous coaxial connectors whose conductive antennas are fixed on the lower transverse bar.

Advantageously, the at least one transverse bar is made of a material having a thermal conductivity of at least 100 W/(m·K).

In a particular embodiment, the at least one transverse bar is made of a material based on at least one of the following metals: copper, brass, aluminum, gold and silver.

According to one possibility of the disclosure, the at least one transverse bar is hollow.

According to another possibility of the disclosure, a cooling liquid is circulated inside the at least one hollow transverse bar.

In accordance with another advantageous feature of the disclosure, by considering microwave sources emitting microwaves at the same given frequency $f_0$ and the same wavelength $\lambda_0$, the at least one transverse bar is disposed at a given length L of the short-circuiting element, along the main axis, with:

$$L = Lc + k \cdot Lg/2, \text{ wherein}$$

k is a zero or positive integer;
Lc=p·λg/4;
Lg=λg±10%;
λg corresponds to the guided wavelength of the microwaves inside the waveguide, which depends on the dimensions of the waveguide;
p is a correction coefficient less than 1.

Indeed, the microwave generator emits microwaves with a frequency $f_0$ and a wavelength $\lambda_0$. Inside the waveguide, the microwaves keep the frequency $f_0$ but the wavelength will be λg, the wavelength guided inside the waveguide, which depends on the dimensions of the waveguide.

Then, from a theoretical point of view, if the conductive antenna(s) and the transverse bar(s) have zero diameters, then we will have Lc=λg/4 and Lg=λg. However, since the conductive antennas and the bars do not have zero diameters and they are large enough to transmit the calories, then the length Lc is less than λg/4, and more precisely we will have Lc=p·λg/4, wherein p is a correction coefficient which takes into account the correction due to the disturbances of the conductive antennas. Moreover, the length Lg is variable around λg, depending on the disturbances induced by the conductive antenna(s) and the transverse bar(s), and therefore we will have Lg=λg±10%.

In the context of the second embodiment, it is advantageous that the proximal transverse bar and the distal transverse bar are disposed at given respective lengths Lprox and Ldist of the short-circuiting element, along the main axis, with:
  Lprox=Lc+kprox·Lg/2, wherein kprox is a zero or positive integer
  Ldist=Lc+kdist·Lg/2, wherein kdist is a positive integer greater than kprox;
  so that the proximal transverse bar and the distal transverse bar are offset from each other along the main axis by a spacing EC such that:
  EC=Ldist−Lprox=(kdist−kprox)·Lg/2=N·Lg/2 wherein N is a positive integer.

In a particular embodiment, EC=Lg/2 with:
  either kprox=0 and kdist=1,
  or kprox=1 and kdist=2

The present disclosure also concerns the feature according to which, for each coaxial connector, the end of the conductive antenna has a diameter less than, greater than or equal to a diameter of the transverse bar on which it is fixed.

In a particular and non-limiting embodiment, for each coaxial connector, the end of the conductive antenna has a diameter equivalent, within 15% to a diameter of the transverse bar on which it is fixed.

According to one feature, for each coaxial connector, the central core has a diameter less than, or conversely greater than, the diameter of the corresponding transverse bar, and the conductive antenna has an increasing, or conversely a decreasing diameter, progressively from the central core until reaching a diameter equivalent, within 15% to the diameter of the transverse bar.

The disclosure also relates to a microwave generator comprising:
  at least two microwave sources emitting microwaves at the same given frequency $f_0$ and the same given wavelength $\lambda_0$; and
  a microwave coupling/combining device as described above;
  and wherein the microwave sources are respectively connected to the coaxial connectors of the microwave coupling/combining device.

According to one possibility, the microwave coupling/combining device comprises two contiguous coaxial connectors whose conductive antennas are fixed on the same transverse bar, these contiguous coaxial connectors being disposed side by side along the transverse axis of the transverse bar, and said contiguous coaxial connectors are connected to microwave sources operating in phase synchronization.

According to another possibility, the microwave coupling/combining device comprises at least one proximal transverse bar and one distal transverse bar parallel and offset from one another along the main axis by a spacing EC=N·Lg/2 wherein N is a positive integer, and the at least two coaxial connectors comprise at least one proximal coaxial connector whose conductive antenna is fixed on the proximal transverse bar and at least one distal coaxial connector whose conductive antenna is fixed on the distal transverse bar, and wherein the proximal coaxial connector and the distal coaxial connector are connected to microwave sources operating:

either in phase synchronization if N is even, plus or minus ten degrees;

or in phase shift of 180 degrees if N is odd, plus or minus ten degrees.

Advantageously, the frequency is adjustable in a given frequency band around the frequency $f_0$ so that the wavelength guided in the waveguide is adjustable in a given wavelength band around the guided wavelength $\lambda g$, and wherein the microwave generator further comprises a module for controlling the phases of the microwave sources for individually adjusting the phases of the microwave sources as a function of the adjustment of the wavelength in the band of given wavelength.

According to an advantageous feature, the microwave sources are solid state microwave sources.

According to another advantageous feature, the frequency is:

either comprised in a frequency band of 2.450 GHz±50.0 MHz, and for example the frequency is adjustable in a frequency band of 2.450 GHz±50.0 MHz;

or comprised in a frequency band of 5.800 GHz±75.0 MHz, for example the frequency is adjustable in a frequency band of 5.800 GHz±75.0 MHz;

or comprised in a frequency band of 433.92 MHz±0.87, and for example the frequency is adjustable in a frequency band of 433.92 MHz±0.87;

or comprised in a frequency band of 896 MHz±10 MHz, and for example the frequency is adjustable in a frequency band of 896 MHz±10 MHz;

or comprised in a frequency band of 915 MHz±13 MHz, and for example the frequency is adjustable in a frequency band of 915 MHz±13 MHz.

BRIEF DESCRIPTION OF THE DRAWINGS

Other features and advantages of the present disclosure will become apparent on reading the detailed description below, of a non-limiting implementation example, made with reference to the appended figures in which.

DETAILED DESCRIPTION OF THE DRAWINGS

Figure 12:
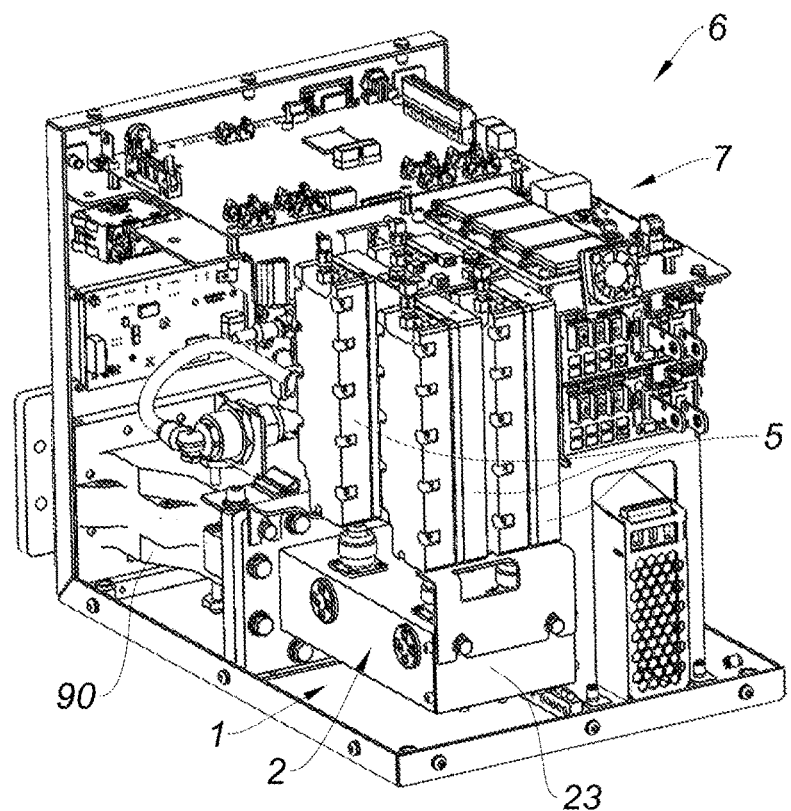
FIGS. 12 and 13 are schematic perspective views, respectively from the front and without casing and from the back and with casing, of a microwave generator incorporating the microwave assembly of FIGS. 10 and 11.
Figure 13:
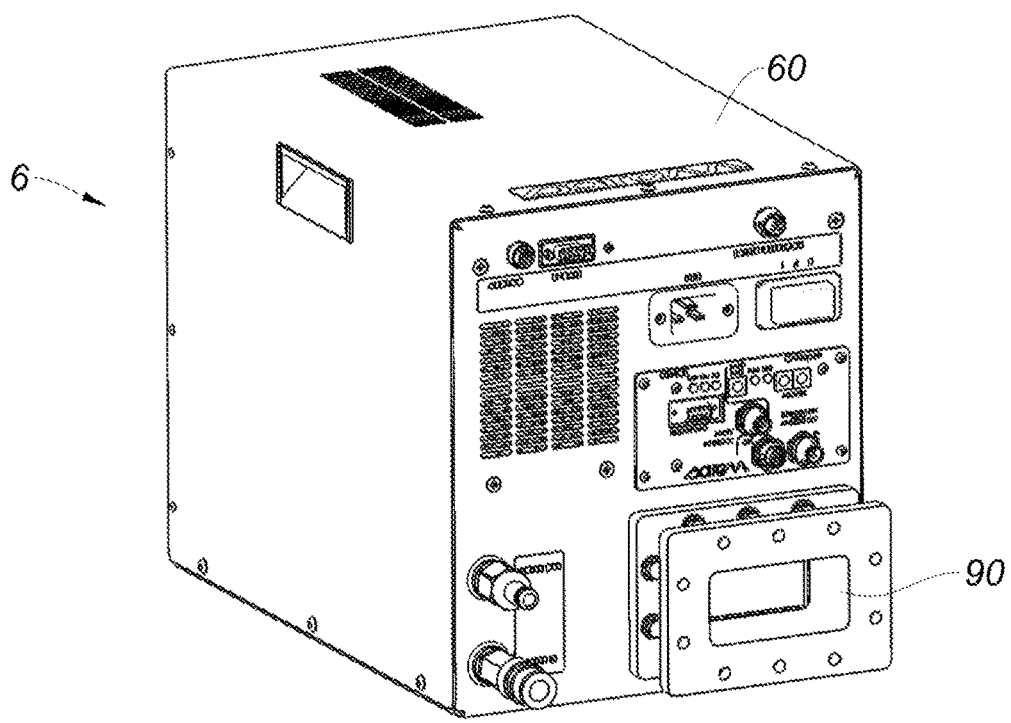

Referring to FIGS. 1 to 9, a microwave coupling/combining device 1 according to the disclosure comprises a waveguide 2 provided with a conductive sleeve 20 extending longitudinally along a main axis X and having two opposite ends 21, 22 comprising:

a first end 21 provided with a short-circuiting element 23, for example in the form of a short-circuiting plate or wall closing the first end 21; and a second open end 22, provided for example with an annular coupling flange 24 provided for coupling the sleeve 20 of the waveguide 2 to an output guide 90 (visible in FIGS. 12 and 13).

The sleeve 20 is here of a rectangular section, so that the sleeve 20 has an upper face 25 and a lower face 26 which are parallel and facing each other, as well as two side faces 27 which are also parallel and facing each other. Of course, the disclosure is not limited to this rectangular geometry of the sleeve 20.

The waveguide 2 also comprises at least one transverse bar 3a, 3b, 3c, 3d extending inside the sleeve 20 along a transverse axis Y orthogonal to the main axis X.

In the examples illustrated in FIGS. 1 to 5 and 7, the waveguide 2 comprises two transverse bars, more specifically with a proximal transverse bar 3a and a distal transverse bar 3b. The proximal transverse bar 3a and the distal transverse bar 3b are parallel and they are offset from each other along the main axis X, with the proximal transverse bar 3a is located closer to the short-circuiting element 23 than the distal transverse bar 3b.

Figure 9:
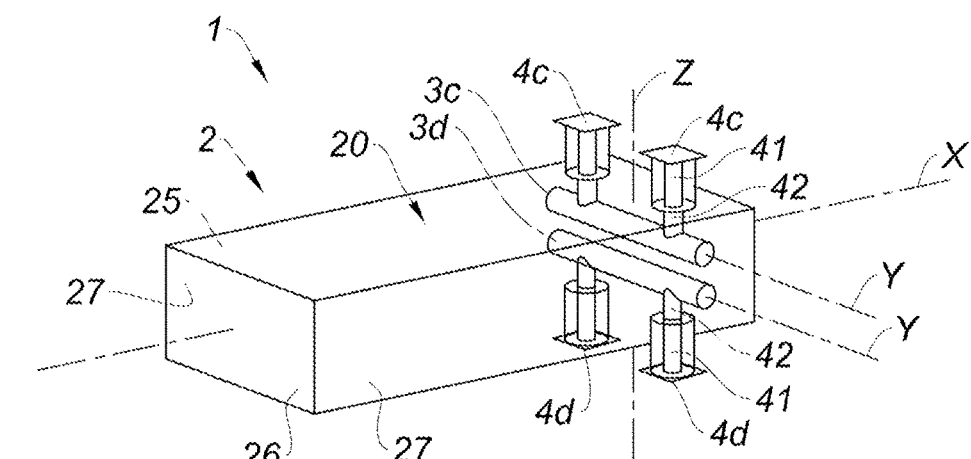
FIG. 9 is a diagram of an example of a fourth example of a microwave coupling/combining device.
Figure 10:
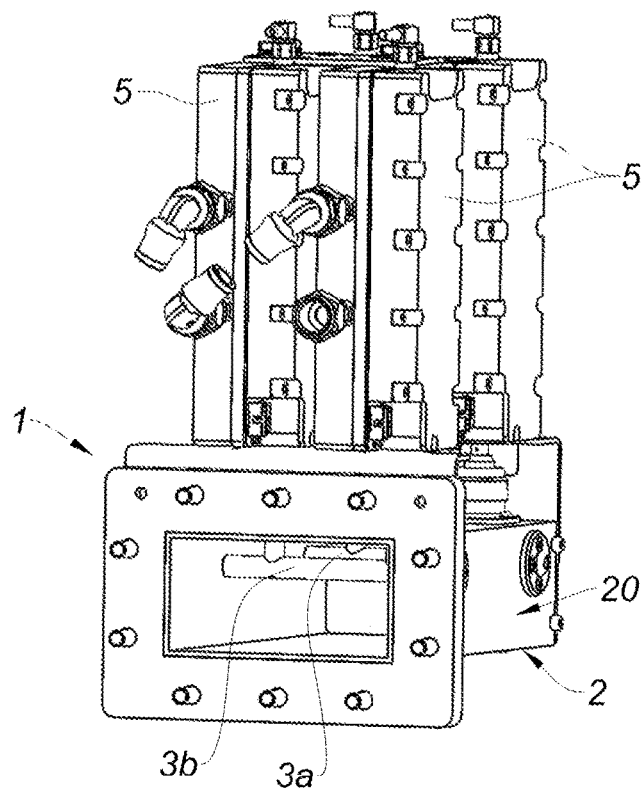
FIGS. 10 and 11 are schematic perspective views of a microwave assembly comprising a microwave coupling/combining device of FIGS. 1 and 2 on which solid state microwave sources are coupled.
Figure 11:
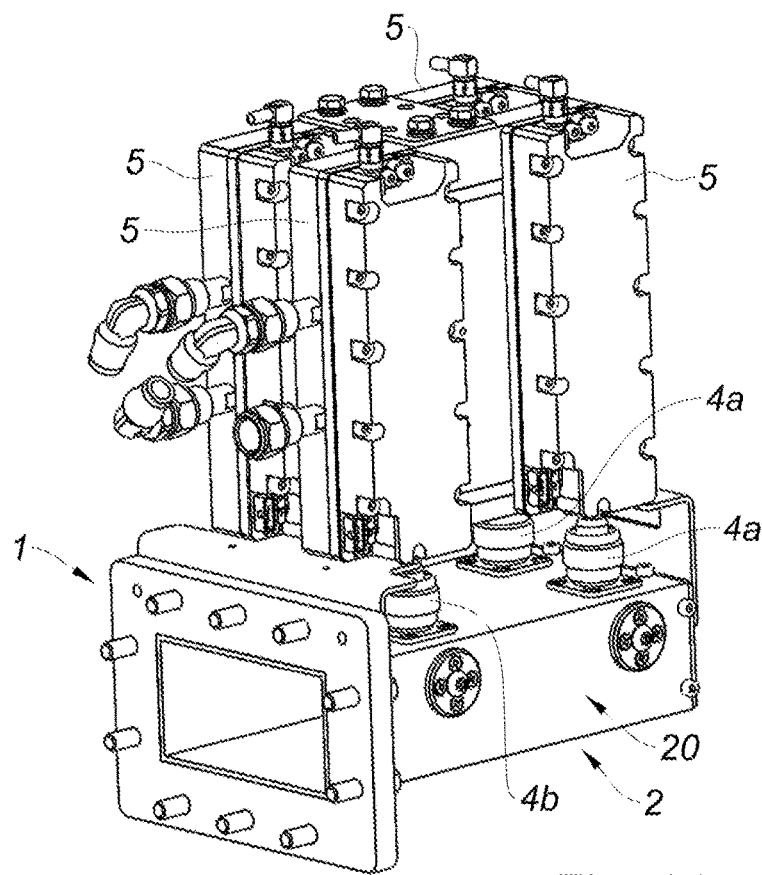

In the example illustrated in FIG. 9, the waveguide 2 comprises two transverse bars, with more specifically an upper transverse bar 3c and a lower transverse bar 3d parallel and offset from one another along a secondary axis Z both orthogonal to the main axis X and to the transverse axes Y of these transverse bars 3c, 3d so that the upper transverse bar 3c and the lower transverse bar 3d extend in a common plane orthogonal to the main axis X. The upper transverse bar 3c is located closer to the upper face 25 than the lower transverse bar 3d. More precisely, the secondary axis Z is orthogonal to the upper face 25 and to the lower face 26.

In general, the or each transverse bar 3a, 3b, 3c, 3d extends between the two lateral faces 27, parallel to the upper face 25 and to the lower face 26, at a given distance from the upper face 25 (or from the lower face 26). As such, the or each transverse bar 3a, 3b, 3c, 3d has two opposite ends each fixed to a lateral face 27, in particular by means of a screw 31 or by welding.

In addition, the or each transverse bar 3a, 3b, 3c, 3d is made of an electrically conductive material having a thermal conductivity of at least 100 W/(m·K), and is in particular made of copper, brass, aluminum, gold or silver, for the purpose of good heat dissipation.

The or each transverse bar 3a, 3b, 3c, 3d may be of a circular section with a given diameter, although this shape is not limiting.

It is further conceivable that the or each transverse bar 3a, 3b, 3c, 3d is hollow so that in particular a cooling liquid can be circulated inside the hollow transverse bar 3a, 3b, 3c, 3d, still for purposes of a good heat dissipation.

The microwave coupling/combining device 1 according to the disclosure also comprises at least two coaxial connectors 4a, 4b, 4c, 4d designed to be respectively connected to microwave sources 5, and particularly to solid microwave sources 5 (visible in FIGS. 10 to 13).

In general, each coaxial connector 4a, 4b, 4c, 4d is mounted externally on the sleeve 20, and particularly on the upper face 25 or the lower face 26, and it has a coupling means for either directly coupling the microwave source 5, or a coaxial cable which ensures the link between the microwave source 5 and the coaxial connector 4a, 4b, 4c, 4d. A direct coupling is favored to limit losses.

The coupling means can be a male or female coupling means, it can also be a screwing or bayonet or snap-fit coupling means, or via a coaxial cable.

Each coaxial connector 4a, 4b, 4c, 4d is therefore fixed on the sleeve 20, in particular by screwing or welding, and it has a central conductive core 41 connected to and extended by a conductive antenna 42 extending inside the sleeve 20 and ending with an end fixed, in particular by welding or screwing, on a transverse bar 3a, 3b, 3c, 3d.

For each coaxial connector 4a, 4b, 4c, 4d, the central conductive core 41 and the conductive antenna 42 are aligned (or coaxial) and extend in a direction orthogonal to the transverse axis Y of the transverse bar 3a, 3b, 3c, 3d, so that the conductive antenna 42 and the transverse bar 3a, 3b, 3c, 3d are perpendicular. More specifically, the conductive central core 41 and the conductive antenna 42 extend in a direction parallel to the aforementioned secondary axis Z, therefore orthogonal to the upper face 25 and to the lower face 26.

In the examples illustrated in the figures, the microwave coupling/combining device 1 comprises two coaxial connectors 4a, 4b, 4c, 4d for a transverse bar 3a, 3b, 3c, 3d. Thus, for the or each transverse bar 3a, 3b, 3c, 3d is coupled a pair (ora couple) of coaxial connectors 4a, 4b, 4c, 4d, that is to say two contiguous coaxial connectors whose conductive antennas 42 are fixed on the same transverse bar 3a, 3b, 3c, 3d, wherein these two contiguous coaxial connectors 4a, 4b, 4c, 4d are disposed side by side in a direction parallel to the transverse axis Y of the transverse bar 3a, 3b, 3c, 3d.

More precisely, two contiguous coaxial connectors 4a, 4b, 4c, 4d are disposed symmetrically on either side of a plane of symmetry of the sleeve 2 including the main axis X. Thus, one of the two contiguous coaxial connectors 4a, 4b, 4c, 4d is located at a given distance from one of the two side faces 27, and the other of the two contiguous coaxial connectors 4a, 4b, 4c, 4d is located at the same given distance from the other of the two side faces 27.

In the examples illustrated in FIGS. 1 to 5 and 7, the waveguide 2 comprises:
 two proximal contiguous coaxial connectors 4a whose conductive antennas 42 are fixed on the proximal transverse bar 3a; and
 two distal contiguous coaxial connectors 4b whose conductive antennas 42 are fixed on the distal transverse bar 3b.

The proximal contiguous coaxial connectors 4a and the distal contiguous coaxial connectors 4b are aligned and offset two by two in a direction parallel to the main axis X.

In the example illustrated in FIG. 9, the waveguide 2 comprises:
 two upper contiguous coaxial connectors 4c mounted on the upper face 25 of the sleeve 20 and whose conductive antennas 42 are fixed on the upper transverse bar 3c; and
 two lower contiguous coaxial connectors 4d mounted on the lower face 26 of the sleeve 20 and whose conductive antennas 42 are fixed on the lower transverse bar 3d.

The conductive antennas of the upper contiguous coaxial connectors 4c and the conductive antennas of the lower contiguous coaxial connectors 4d are aligned two by two. Moreover, these contiguous coaxial connectors 4c, 4d extend in the common plane of the upper transverse bar 3c and of the lower transverse bar 3d.

Furthermore, it should be noted that the solid state microwave sources 5 emit microwaves at the same frequency $f_0$ and the same given wavelength $\lambda_0$, with a frequency band which is for example 2.450 GHz±50.0 MHz, or the frequency is more particularly adjustable in this frequency band of 2.450 GHz±50.0 MHz with $f_0$ is the center frequency of the band.

Of course, other microwave frequency bands for industrial, scientific and medical (ISM) use allocated by the International Telecommunications Union (ITU) are also possible.

In general, the or each transverse bar 3a, 3b, 3c, 3d is disposed at a given length L of the short-circuiting element 23, along the main axis, with:

$Lc + k \cdot Lg/2$, wherein k is a zero or positive integer;
$Lc = p \cdot \lambda g/4$;
$Lg = \lambda g \pm 10\%$;
$\lambda g$ corresponds to the guided wavelength of the microwaves inside the waveguide, which depends on the dimensions of the waveguide;
p is a correction coefficient less than 1.

In the examples of FIGS. 1 to 7, the proximal transverse bar 3a and the distal transverse bar 3b are disposed at given respective lengths Lprox and Ldist of the short-circuiting element 23, along the main axis X, with:
 Lprox=Lc+kprox·Lg/2, wherein kprox is a zero or positive integer
 Ldist=Lc+kdist·Lg/2, wherein kdist is a positive integer greater than kprox.

Thus, the proximal transverse bar 3a and the distal transverse bar 3b are offset from each other along the main axis by a spacing EC, such as:
 EC=Ldist−Lprox=(kdist−kprox). Lg/2=N. Lg/2 wherein N is a positive integer.

In the examples of FIGS. 1 to 4 and 7, which corresponds to a particularly compacted configuration, we have kprox=0 and kdist=1,
 in other words: Lprox=Lc, Ldist=Lc+Lg/2 and EC=Lg/2.

Figure 1:
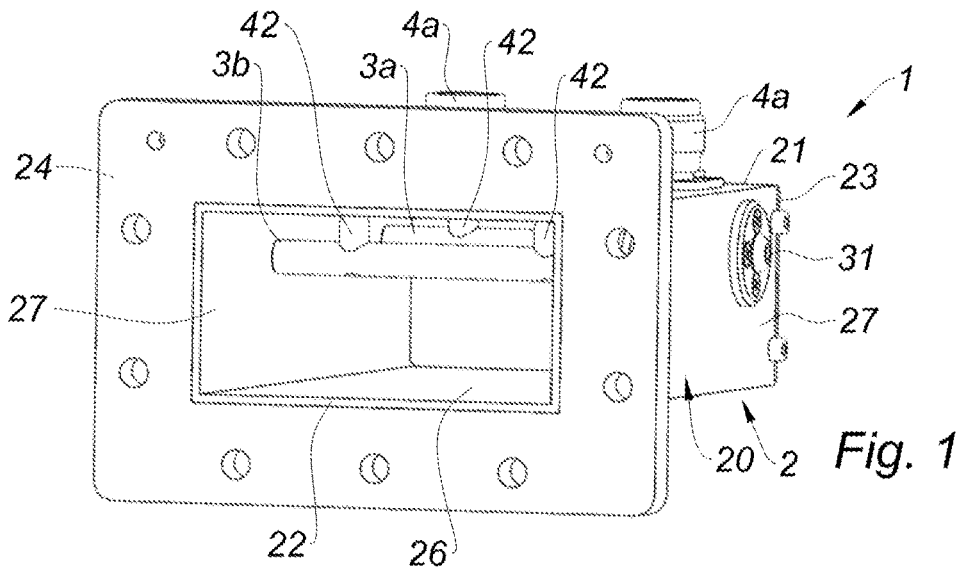
FIGS. 1 and 2 are schematic perspective views of a microwave coupling/combining device according to the disclosure.
Figure 2:
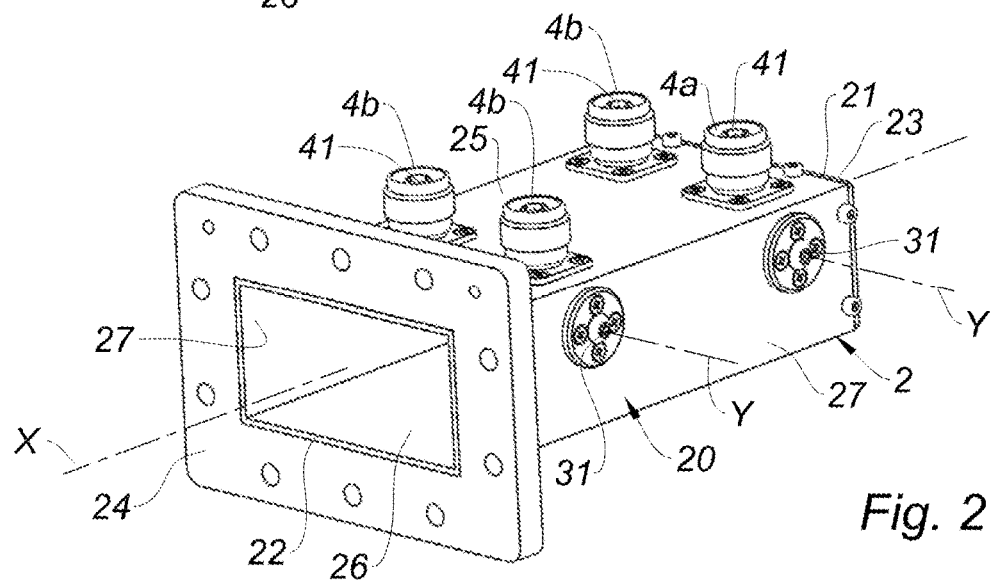
Figure 3:
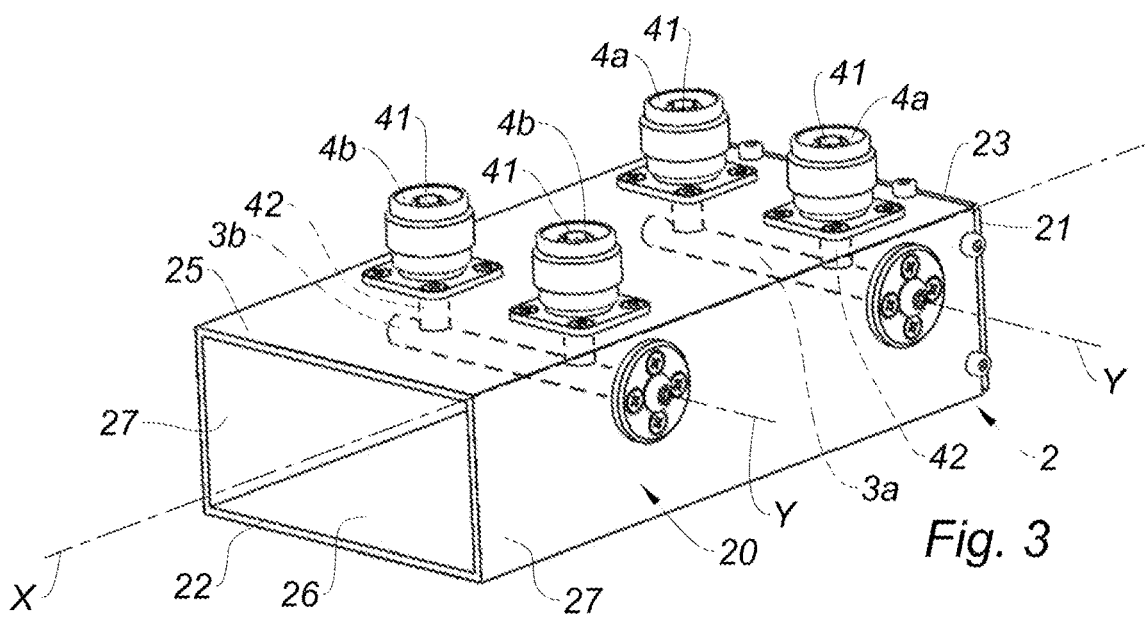
FIG. 3 is a schematic view of the microwave coupling/combining device without the annular coupling flange and with a transparent representation of the inside of the waveguide sleeve.
Figure 4:
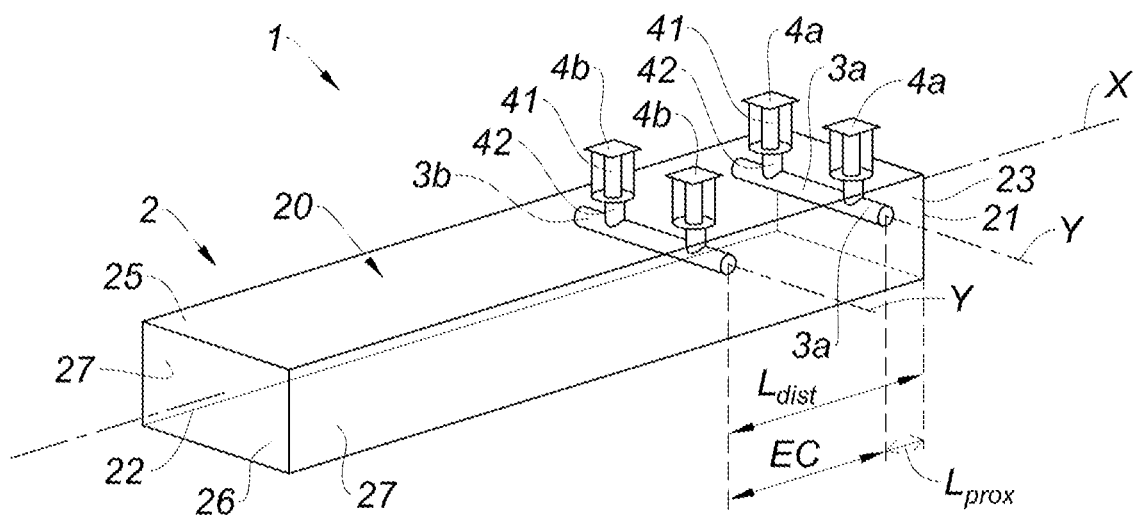
FIGS. 4 and 5 are diagrams of a first example and a second example of a microwave coupling/combining device.
Figure 5:
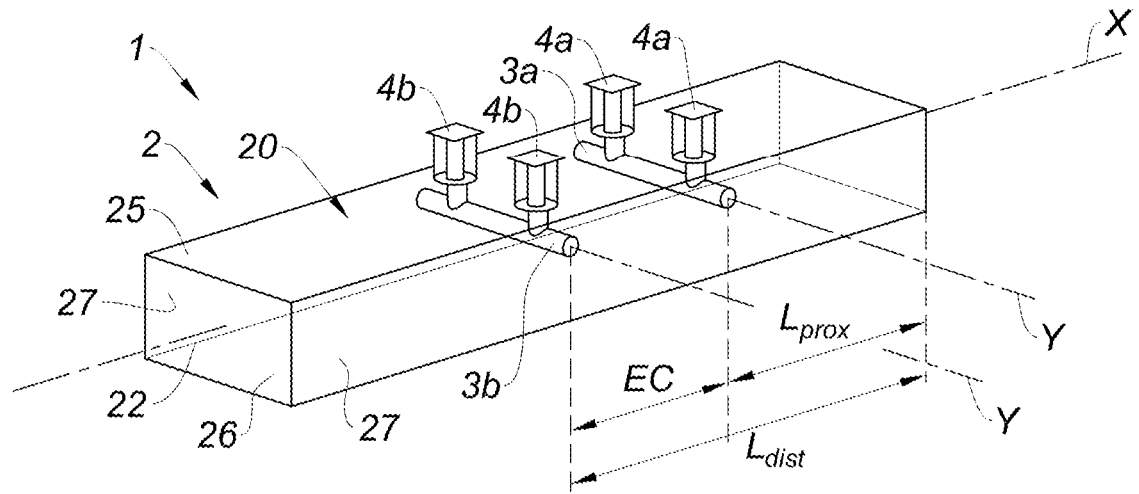
Figure 6:
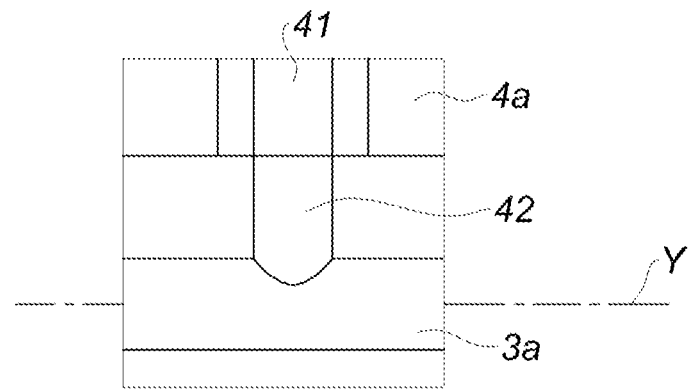
FIG. 6 is a schematic zoomed view of a coaxial connector/conductive central core/conductive antenna/transverse bar, in the examples of FIGS. 4 and 5.
Figure 7:
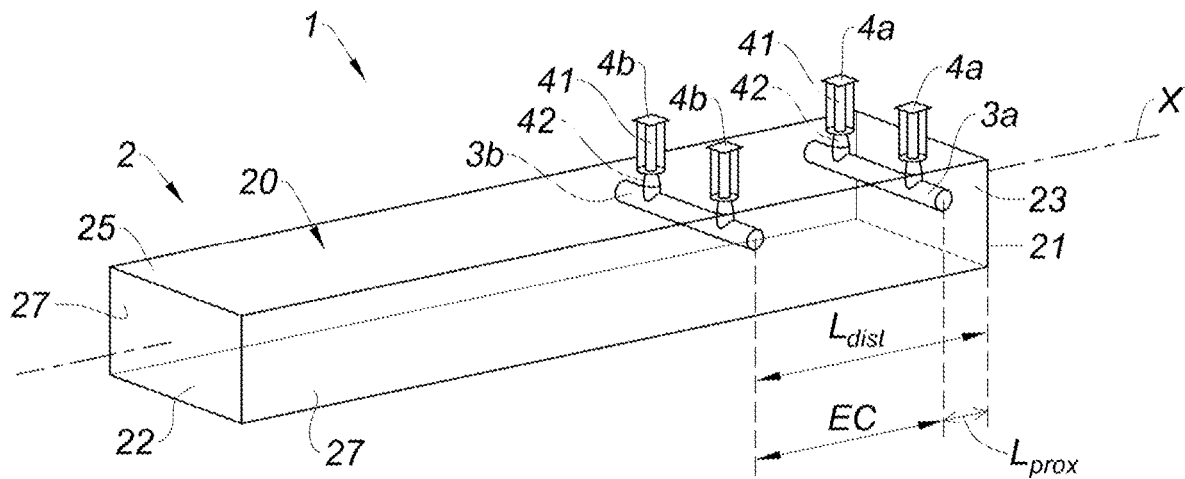
FIG. 7 is a diagram of an example of a third example of a microwave coupling/combining device.

In the example of FIG. 5, which corresponds to a less compacted configuration but which could sometimes have an advantage on the bandwidth of the combined microwaves, we have kprox=1 and kdist=2, in other words:
Lprox=Lc+Lg/2, Ldist=Lc+Lg and EC=Lc/2

In the example of FIG. 9, which also corresponds to a particularly compacted configuration, the upper transverse bar 3c and the lower transverse bar 3d are both located at the same given length L of the short-circuiting element 23, along the main axis,
 with: L=Lc.

Furthermore, for each coaxial connector 4a, 4b, 4c, 4d, the end of the conductive antenna 42 has a diameter less than, greater than or equal to the diameter of the transverse bar 3a, 3b, 3c, 3d on which it is fixed.

Figure 8:
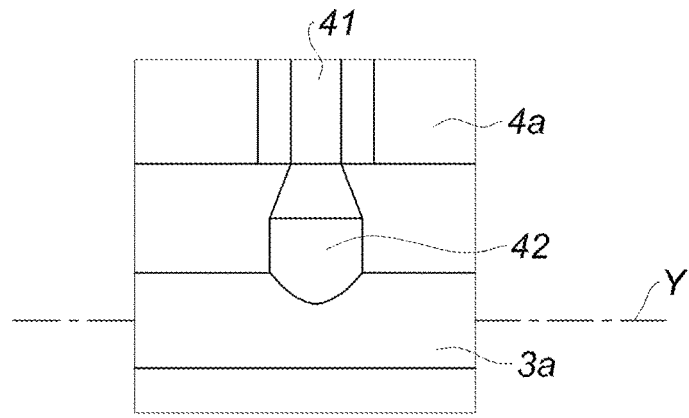
FIG. 8 is a zoomed schematic view of a coaxial connector/conductive central core/conductive antenna/transverse bar, in the third example of FIG. 7.

In a particular embodiment, given by way of non-limiting example, for each coaxial connector 4a, 4b, 4c, 4d, the end of the conductive antenna 42 has a diameter equivalent, within 15% to the diameter of the transverse bar 3a, 3b, 3c, 3d on which it is fixed, and thus three cases arise:

first case illustrated in FIG. 5, if the central conductive core 41 has a diameter equivalent, within 15% to the diameter of the transverse bar 3a, 3b, 3c, 3d, then the central conductive core 41 and the conductive antenna 42 have the same constant diameter;

second case illustrated in FIG. 8, if the central conductive core 41 has a diameter smaller than the diameter of the transverse bar 3a, 3b, 3c, 3d, then the conductive antenna 42 has a diameter gradually increasing from the central conductive core 41 until it reaches a diameter equivalent, within to 15% to the diameter of the transverse bar 3a, 3b, 3c, 3d;

third case not illustrated, if the central conductor 41 has a diameter greater than the diameter of the transverse bar 3a, 3b, 3c, 3d, then the conductive antenna 42 has a diameter gradually decreasing from the central conductive core 41 until reaching a diameter equivalent, within 15% to the diameter of the transverse bar 3a, 3b, 3c, 3d.

Referring to FIGS. 12 and 13, a microwave generator 6 according to the disclosure comprises, inside a casing 60:

a microwave coupling/combining device 1; and several solid state microwave sources 5 connected respectively to the coaxial connectors 4a, 4b, 4c, 4d of the microwave coupling/combining device 1;

a control module 7 which controls the phases of the solid state microwave sources 5 to individually adjust the phases of the solid state microwave sources 5.

Considering two contiguous coaxial connectors 4a, or 4b, or 4c, or 4d, whose conductive antennas 42 are fixed on the same transverse bar 3a, or 3b, or 3c, or 3d, these two contiguous coaxial connectors are connected to solid state microwaves sources 5 operating in phase synchronization, at plus or minus ten degrees, this phases synchronization of these two solid state microwave sources 5 being controlled by the control module 7.

Considering, on the one hand, two proximal contiguous coaxial connectors 4a whose conductive antennas 42 are fixed on the proximal transverse bar 3a and which are coupled to solid state microwave sources 5 called proximal sources and, on the other hand, two distal contiguous coaxial connectors 4b whose conductive antennas 42 are fixed on the distal transverse bar 3b and which are coupled to solid state microwave sources 5 called distal sources, and considering that this proximal transverse bar 3a and this distal transverse bar 3b are offset from each other along the main axis X by a spacing EC=N·Lg/2 wherein N is a positive integer, then:

if N is even, then the proximal sources are in phase synchronization with the distal sources, plus or minus ten degrees; and if N is odd, then the proximal sources are in phase shift of 180 degrees with the distal sources, plus or minus ten degrees In the examples of FIGS. 1 to 5 and 7, EC=Lg/2, in other words N=1, so that the proximal sources are in phase shift of 180 degrees with the distal sources, plus or minus ten degrees.

Thus, the control module 7 implements a phase management card, preferably automatic, in order to synchronize together the solid state microwave sources 5 associated with the same transverse bar 3a, or 3b, or 3c, or 3d, and phase shift the others with respect to the first ones by 180° (if the spacing EC=Lg/2).

Moreover, as described above, the frequency is adjustable in a given frequency band around the frequency $f_0$ so that the guided wavelength is also adjustable in a given wavelength band around the wavelength $\lambda_g$.

Thus, the phase control module 7 of the solid state microwave sources 5 will individually control the phases of the solid state microwave sources 5 as a function of this adjustment of the wavelength guided in the given wavelength band, to optimize power transmission.

This control module 7 will also allow individual management of the phases of each solid state microwave source 5 to take into account any phase shifts that may appear because of the tolerances on the dimensions, the tolerances of each solid state microwave source 5, between the coaxial connectors 4a, 4b, 4c, 4d themselves, etc. This phase management can also be managed automatically as a function of the frequency of the emitted microwaves.

The invention claimed is:

1. A microwave coupling/combining device for coupling and combining at least two microwave sources, comprising a waveguide provided with:

a sleeve extending longitudinally along a main axis and having two opposite ends comprising a first end provided with a short-circuiting element and a second open end; and at least one transverse bar extending inside the sleeve along a transverse axis orthogonal to the main axis;

said microwave coupling/combining device further comprising at least two coaxial connectors provided to be respectively connected to microwave sources, wherein each coaxial connector among the at least two coaxial connectors is externally mounted on the sleeve and has a conductive central core connected to and extended by a conductive antenna extending inside of the sleeve and ending by an end attached to one of the at least one transverse bar, wherein said conductive central core and said conductive antenna are aligned and extend in a direction orthogonal to the transverse axis and to the main axis;

and wherein the at least two coaxial connectors comprise two contiguous coaxial connectors whose conductive antennas are fixed on a same transverse bar, said two contiguous coaxial connectors being disposed side by side in a direction parallel to the transverse axis of the transverse bar.

2. The microwave coupling/combining device according to claim 1, wherein the two contiguous coaxial connectors are disposed symmetrically on either side of a plane of symmetry of the sleeve including the main axis, said plane of symmetry also including a secondary axis both orthogonal to the main axis and to the transverse axis of one of the at least one transverse bar.

3. The microwave coupling/combining device according to claim 1, wherein the at least one transverse bar comprises at least one proximal transverse bar and at least one distal transverse bar parallel and offset from each other along the main axis, and the at least two coaxial connectors comprise at least one proximal coaxial connector whose conductive antenna is fixed on one of the at least one proximal transverse bar and at least one distal coaxial connector whose conductive antenna is fixed on one of the at least one distal transverse bar.

4. The microwave coupling/combining device according to claim 3, wherein the at least one proximal coaxial connector and the at least one distal coaxial connector are offset from each other in a direction parallel to the main axis.

5. The microwave coupling/combining device according to claim 3, wherein the at least two coaxial connectors comprise:

two proximal contiguous coaxial connectors whose conductive antennas are fixed on one of the at least one proximal transverse bar; and two distal contiguous coaxial connectors whose conductive antennas are fixed on one of the at least one distal transverse bar.

6. The microwave coupling/combining device according to claim 3, wherein, by considering microwave sources emitting microwaves at the same frequency $f_0$ and the same given wavelength $\lambda_0$, the at least one proximal transverse bar and the at least one distal transverse bar are disposed at the given respective lengths Lprox and Ldist of the short-circuiting element, along the main axis, with:

Lprox=Lc+kprox·Lg/2, wherein kprox is a zero or positive integer;

Ldist=Lc+kdist·Lg/2, wherein kdist is a positive integer greater than kprox;

Lc=p·$\lambda$g/4;

Lg=$\lambda$g plus or minus 10 percent;

$\lambda$g corresponds to the guided wavelength of the microwaves inside of the waveguide, which depends on the dimensions of the waveguide;

p is a correction coefficient less than 1;

so that the at least one proximal transverse bar and the at least one distal transverse bar are offset from each other along the main axis by a spacing EC such that:

EC=Ldist−Lprox=(kdist−kprox)·Lg/2=N·Lg/2 wherein N is a positive integer.

7. The microwave coupling/combining device according to claim 6, wherein EC=Lg/2 with:

either kprox=0 and kdist=1, or kprox=1 and kdist=2.

8. The microwave coupling/combining device according to claim 1, wherein the at least one transverse bar comprises at least one upper transverse bar and at least one lower transverse bar parallel and offset from each other along a secondary axis both orthogonal to the main axis and to the transverse axes of said transverse bars so that the at least one upper transverse bar and the at least one lower transverse bar extend in a common plane orthogonal to the main axis, and the at least two coaxial connectors comprise at least one upper coaxial connector mounted on an upper face of the sleeve and whose conductive antenna is fixed on one of the at least one upper transverse bar and at least one lower coaxial connector mounted on a lower face of the sleeve and whose conductive antenna is fixed on one of the at least one lower transverse bar, and wherein the at least one lower coaxial connector and the at least one upper coaxial connector extend in the common plane.

9. The microwave coupling/combining device according to claim 8, wherein the conductive antenna of the at least one lower coaxial connector and the conductive antenna of the at least one upper coaxial connector are aligned.

10. The microwave coupling/combining device according to claim 8, wherein the at least two coaxial connectors comprise:

two upper contiguous coaxial connectors whose conductive antennas are fixed on one of the at least one upper transverse bar; and two lower contiguous coaxial connectors whose conductive antennas are fixed on one of the at least one lower transverse bar.

11. The microwave coupling/combining device according to claim 1, wherein the at least one transverse bar is made of a material having a thermal conductivity of at least 100 W/(m·k).

12. The microwave coupling/combining device according to claim 1, wherein the at least one transverse bar is made of a material based on at least one of the following metals: copper, brass, aluminum, gold and silver.

13. The microwave coupling/combining device according to claim 1, wherein the at least one transverse bar comprises at least one hollow transverse bar.

14. The microwave coupling/combining device according to claim 13, wherein a cooling liquid is circulated inside the at least one hollow transverse bar.

15. The microwave coupling/combining device according to claim 1, wherein, by considering microwave sources emitting microwaves at the same frequency $f_0$ and the same given wavelength Xo, the at least one transverse bar is disposed at a given length L of the short-circuiting element, along the main axis, with:

$$L=Lc+k \cdot Lg/2, \text{ wherein}$$

k is a zero or positive integer;

Lc=p·$\lambda$g/4;

Lg=$\lambda$g±10%;

$\lambda$g corresponds to the guided wavelength of the microwaves inside the waveguide, which depends on the dimensions of the waveguide;

p is a correction coefficient less than 1.

16. The microwave coupling/combining device according to claim 1, wherein, for each coaxial connector among the at least two coaxial connectors, the end of the conductive antenna has an equivalent diameter, within 15 percent to a diameter of the transverse bar on which it is fixed.

17. The microwave coupling/combining device according to claim 16, wherein, for each coaxial connector among the at least two coaxial connectors, the conductive central core has a diameter smaller than, or conversely greater than, the diameter of the corresponding transverse bar, and the conductive antenna has an increasing, or conversely decreasing diameter, progressively from the central conductive core until reaching a diameter equivalent, within 15 percent to the diameter of the transverse bar.

18. A microwave generator comprising:

at least two microwave sources emitting microwaves at the same frequency $f_0$ and the same given wavelength $\lambda_0$; and a microwave coupling/combining device in accordance to claim 1;

and wherein the at least two microwave sources are respectively connected to the at least two coaxial connectors of the microwave coupling/combining device.

19. The microwave generator according to claim 18, wherein the at least two coaxial connectors comprises two contiguous coaxial connectors that are connected to two of the at least two microwave sources operating in phase synchronization.

20. The microwave generator according to claim 19, wherein the at least one transverse bar is disposed at a given length L of the short-circuiting element, along the main axis, with:

$$L=Lc+k \cdot Lg/2, \text{ wherein}$$

k is a zero or positive integer;

Lc=p·$\lambda$g/4;

Lg=$\lambda$g plus or minus 10 percent;

$\lambda$g corresponds to the guided wavelength of the microwaves inside of the waveguide, which depends on the dimensions of the waveguide;

p is a correction coefficient less than 1;

and wherein the frequency is adjustable in a given frequency band around the frequency $f_0$ so that the wavelength guided in the waveguide is adjustable in a given wavelength band around the wavelength $\lambda g$, and wherein the microwave generator comprises a module for controlling the phases of the at least two microwave sources for individually adjusting the phases of the at least two microwave sources according to an adjustment of the wavelength in the given wavelength band.

21. The microwave generator according to claim 18, wherein the at least one transverse bar comprises at least one proximal transverse bar and at least one distal transverse bar parallel and offset from each other along the main axis, wherein the at least one proximal transverse bar and the at least one distal transverse bar are disposed at respective lengths Lprox and Ldist of the short-circuiting element, along the main axis, with:

Lprox=Lc+kprox·Lg/2, wherein kprox is a zero or positive integer;

Ldist=Lc+kdist·Lg/2, wherein kdist is a positive integer greater than kprox;

Lc=p·λg/4;

Lg=λg plus or minus 10 percent;

λg corresponds to the guided wavelength of the microwaves inside of the waveguide, which depends on the dimensions of the waveguide;

p is a correction coefficient less than 1;

so that the at least one proximal transverse bar and the at least one distal transverse bar are offset from each other along the main axis by a spacing EC such that:

EC=Ldist−Lprox=(kdist−kprox)·Lg/2=N·Lg/2 wherein N is a positive integer, and wherein the at least two coaxial connectors comprise at least one proximal coaxial connector whose conductive antenna is fixed on one of the at least oneproximal transverse bar and at least one distal coaxial connector whose conductive antenna is fixed on one of the at least one transverse bar distal, and wherein the at least one proximal coaxial connector and the at least one distal coaxial connector are connected to two of the at least two microwave sources operating:

either in phase synchronization if N is even, plus or minus ten degrees;

or in phase shift of 180 degrees if N is odd, plus or minus ten degrees.

22. The microwave generator according to claim 18, wherein the at least two microwave sources are solid state microwave sources.

23. The microwave generator according to claim 18, wherein the frequency is:

either comprised in a frequency band of 2.450 GHz±50.0 MHz, and for example the frequency is adjustable in a frequency band of 2.450 GHz±50.0 MHz;

or comprised in a frequency band of 5.800 GHz±75.0 MHz, and for example the frequency is adjustable in a frequency band of 5.800 GHz±75.0 MHz;

or comprised in a frequency band of 433.92 MHz±0.87, and for example the frequency is adjustable in a frequency band of 433.92 MHz±0.87;

or comprised in a frequency band of 896 MHz±10 MHz, and for example the frequency is adjustable in a frequency band of 896 MHz±10 MHz;

or comprised in a frequency band of 915 MHz±13 MHz, and for example the frequency is adjustable in a frequency band of 915 MHz±13 MHz.

24. A microwave coupling/combining device for coupling and combining at least two microwave sources, comprising a waveguide provided with:

a sleeve extending longitudinally along a main axis and having two opposite ends comprising a first end provided with a short-circuiting element and a second open end; and at least one transverse bar extending inside the sleeve along a transverse axis orthogonal to the main axis;

said microwave coupling/combining device further comprising at least two coaxial connectors provided to be respectively connected to microwave sources, wherein each coaxial connector among the at least two coaxial connectors is externally mounted on the sleeve and has a conductive central core connected to and extended by a conductive antenna extending inside of the sleeve and ending by an end attached to one of the at least one transverse bar, wherein said conductive central core and said conductive antenna are aligned and extend in a direction orthogonal to the transverse axis and to the main axis;

and wherein, by considering microwave sources emitting microwaves at the same frequency f0 and the same given wavelength λ0, the at least one transverse bar is disposed at a given length L of the short-circuiting element, along the main axis, with:

$L=Lc+k \cdot Lg/2$, wherein k is a zero or positive integer;

Lc=p·λg/4;

Lg=λg plus or minus 10 percent;

λg corresponds to the guided wavelength of the microwaves inside of the waveguide, which depends on the dimensions of the waveguide;

p is a correction coefficient less than 1.

25. A microwave coupling/combining device for coupling and combining at least two microwave sources, comprising a waveguide provided with:

a sleeve extending longitudinally along a main axis and having two opposite ends comprising a first end provided with a short-circuiting element and a second open end; and at least one transverse bar extending inside the sleeve along a transverse axis orthogonal to the main axis;

said microwave coupling/combining device further comprising at least two coaxial connectors provided to be respectively connected to microwave sources, wherein each coaxial connector among the at least two coaxial connectors is externally mounted on the sleeve and has a conductive central core connected to and extended by a conductive antenna extending inside of the sleeve and ending by an end attached to one of the at least one transverse bar, wherein said conductive central core and said conductive antenna are aligned and extend in a direction orthogonal to the transverse axis and to the main axis;

wherein the at least one transverse bar comprises at least one hollow transverse bar, wherein a cooling liquid is circulated inside the at least one hollow transverse bar.

* * * * *